(12) United States Patent
Dono et al.

(10) Patent No.: US 7,987,399 B2
(45) Date of Patent: Jul. 26, 2011

(54) SYSTEM AND METHOD FOR ELECTRONIC DEVICE DEVELOPMENT

(75) Inventors: Richard Dono, Dripping Springs, TX (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 11/758,708

(22) Filed: Jun. 6, 2007

(65) Prior Publication Data

US 2008/0307282 A1 Dec. 11, 2008

(51) Int. Cl.
*G01R 31/28* (2006.01)
(52) U.S. Cl. .................................. 714/726; 714/731
(58) Field of Classification Search .................. 714/724, 714/738, 739, 726, 741; 716/4; 703/14
See application file for complete search history.

(56) References Cited

U.S. PATENT DOCUMENTS

| 5,592,077 | A | * | 1/1997 | Runas et al. | 324/158.1 |
| 6,630,754 | B1 | * | 10/2003 | Pippin | 307/117 |
| 6,810,497 | B2 | * | 10/2004 | Yamada | 714/724 |
| 2004/0268181 | A1 | * | 12/2004 | Wang et al. | 714/30 |

* cited by examiner

*Primary Examiner* — Jeffrey A Gaffin
*Assistant Examiner* — Daniel F McMahon
(74) *Attorney, Agent, or Firm* — The Caldwell Firm, LLC; Patrick E. Caldwell, Esq.

(57) ABSTRACT

A test card system for use in product development includes a device under test (DUT). The DUT comprises: a mount plane; a power input port coupled to the mount plane; a JTAG input port coupled to the mount plane; a clock signal distribution network coupled to the JTAG input port; a plurality of latches coupled to the clock signal distribution network and the power input port; and an output port coupled to the plurality of latches. A test card (TC) couples to the DUT, comprising: a JTAG interface coupled to the DUT JTAG input port and configured to provide test data to the DUT; a clock module coupled to the DUT clock signal distribution network and configured to generate a clock signal; and an analysis module coupled to the DUT output port and configured to receive data from the DUT.

18 Claims, 3 Drawing Sheets

SYSTEM AND METHOD FOR ELECTRONIC DEVICE DEVELOPMENT

TECHNICAL FIELD

The present invention relates generally to the field of computer and electronic circuit design and development and, more particularly, to a system and method for electronic device development.

BACKGROUND OF THE INVENTION

In many modern electronic device development processes, new technologies used in integrated circuit (IC) modules are "qualified" through a series of formal test stages with different sets of test vehicle hardware and firmware. Generally, the entire process guides a product design or feature from conception as an idea, through functional design and development, to integration with existing devices as a final product. At each stage of development, most design processes test products in development in objective, clinical assessments. FIG. 1 illustrates an exemplary design process.

Specifically, FIG. 1 is a block diagram illustrating selected development milestones in a product development process 100. As indicated at block 105, process 100 begins with recognition and identification of a problem. In this phase, design engineers (or others) notice a problem or otherwise identify a design goal. Next, as indicated at block 110, the design engineers conceive of one or more basic approaches to solving the identified problem or otherwise achieving the design goal.

Next, as indicated at block 115, the design engineers conceive and design or sketch various implementations to carry out the one or more basic approaches. In this phase, the design engineers begin to create and build concrete structural designs, called "pre-T0 devices" herein, shown as Pre-T0 devices 117. Next, as indicated at block 120, the design engineers conduct pre-T0 stage testing. Generally, testing at this stage sorts out the various design options and often eliminates some designs as unworkable or otherwise inappropriate for continued development.

Accordingly, as indicated at block 125, the design engineers cull the designs under test that do not achieve the identified goal or solve the problem identified at step 105. One skilled in the art will understand that product development and invention are rarely purely linear processes. Throughout the development process, design engineers revise the products under development, based on test results and, sometimes, experimentation. Frequently, testing certain products spark ideas that are further developed in addition to, or instead of, the original solution approaches. Thus, at any point in the process 100, new approaches can be conceived and developed beginning with step 110. The designs that remain after step 125 are shown as T0 devices 127.

Next, as indicated at block 130, the design engineers design and build special test vehicles to test concepts and designs of the T0 devices 127. Generally, special or "custom" test vehicles are specially designed circuits configured to focus on a particular, narrow characteristic of a device under development. For example, the design engineers can design a special thermal test vehicle to test the substrate characteristics of the T0 devices 127. In another example, the design engineers can design a special mechanical test vehicle to test the couplings of the T0 devices 127. These test vehicles are shown as T0 test vehicles 132. Next, as indicated at block 135, the design engineers conduct T0 stage testing on T0 test vehicles 132.

Next, as indicated at block 140, the design engineers eliminate unworkable or otherwise unacceptable designs, narrowing the technologies under active development. The designs that remain after step 140 are shown as T1 devices 142. With a much narrower set of acceptable technologies identified at the conclusion of T0, the design engineers design test vehicles for a T1 stage of testing, as depicted at block 145.

These test vehicles are shown as T1 test vehicles 147. Next, as indicated at block 150, the design engineers conduct T1 stage testing on T1 test vehicles 147. In many instances, T1 stage testing also includes vendor-tooled technologies. That is, in some cases, the design engineers obtain some T1 test vehicles 147 from outside sources, including clients. The T1 test vehicles are nevertheless still configured to allow failure analysis on certain device or technology components, which helps identify some problems with the new technologies.

Next, as indicated at block 155, the design engineers again eliminate unworkable or otherwise unacceptable designs, and generally revise current designs in light of the T1 testing. The designs that remain after step 155 are shown as T2 devices 157. T2 devices 157 are substantially closer to a finished product than, for example, Pre-T0 devices 117. Generally, T2 devices 157 are product-level designs, manufactured on a production line under a quality-control program.

Next, as indicated at block 160, the design engineers conduct T2 testing on the T2 devices 157. The design engineers revise the T2 designs in light of the T2 testing, as indicated at block 165. The final devices are "qualified" as devices for manufacture and distribution, and are shown as devices for manufacture 167. One skilled in the art will understand that the design engineers can also re-test the revised designs, effectively repeating steps 160 and 165 until they settle on a final design.

One skilled in the art will understand that with the rapid pace of technology enhancement, in part due to the demands of the competitive landscape, each new generation of servers and/or chip sets brings a continual advance of new technologies. As such, qualification cycles for processor packaging are frequently in the critical path of product general availability. Accordingly, delays in qualification cycles can therefore cause related increases in development and distribution costs.

Further, as described above, typical processing cycles include development of, for example, T0 test vehicles 132 and T1 test vehicles 147. These custom test vehicles require some design sophistication to match product chip maps, but often those maps change from pass to pass in the design process, requiring extrapolation to bridge the test vehicle results to that of the current device configuration. That is, the device development does not always exactly track the test vehicle development. This causes inaccuracies in the test results.

Further, to help reduce custom test vehicle cost, test vehicles often do not include design attributes that, by engineering judgment, are not believed to drive large sensitivities in technology performance. That is, the custom test vehicles generally only test those design attributes that the design engineers believe will have the most significant impact on the performance of the final design. But, as described above, the design engineers design and develop the test vehicles well in advance of the product, in anticipation of the final product attributes, instead of reflecting the actual attributes. Accordingly, it is often difficult to predict which design attributes are the most important to test or how the interaction of certain design attributes may affect overall performance.

As such, many of the final product characteristics are not embodied in the test vehicles, and therefore the related technology and application interactions are often overlooked.

This greatly increases costs when problems are discovered later in the development cycle, because specific interactions between certain attributes can only be observed in the later-developed product (e.g., T2 devices 157) and are not reducible to test vehicles designed to target individual technology aspects.

Additionally, current testing protocols often require costly negative approaches to qualification. That is, engineers often spend a significant amount of design time designing tests to prove that a failure observed using a custom test vehicle cannot happen in the final product. But these added costs seem inherent in the partial-technology approach to custom test vehicles that is prevalent in modern device development.

Therefore, there is a need for a system and/or method for electronic device development that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved electronic device development method.

It is a further aspect of the present invention to provide for an improved electronic device development system.

It is a further aspect of the present invention to provide for an improved development device testing system.

It is a further aspect of the present invention to provide for an improved development device testing method.

The aforementioned aspects and other objectives and advantages can now be achieved as described herein. A test card system for use in product development includes a device under test (DUT). The DUT comprises: a mount plane; a power input port coupled to the mount plane; a JTAG input port coupled to the mount plane; a clock signal distribution network coupled to the JTAG input port; a plurality of latches coupled to the clock signal distribution network and the power input port; and an output port coupled to the plurality of latches. A test card (TC) couples to the DUT, comprising: a JTAG interface coupled to the DUT JTAG input port and configured to provide test data to the DUT; a clock module coupled to the DUT clock signal distribution network and configured to generate a clock signal; and an analysis module coupled to the DUT output port and configured to receive data from the DUT.

In an alternate embodiment, a method for electronic product development includes configuring a device under test (DUT) to comprise: early product hardware (EPH) for development; a JTAG input port couples to the EPH; a clock signal distribution network coupled to the EPH; and an output port. A test system couples a test card (TC) to the DUT, the TC comprising: a JTAG interface coupled to the DUT JTAG input port; a clock module coupled to the DUT clock signal distribution network; and an analysis module coupled to the DUT output port. The TC provides a clock signal to the DUT. The TC provides test initialization commands to the DUT, wherein the test initialization commands comprise initial settings for latches of the DUT. And the TC receives a test response of the DUT.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
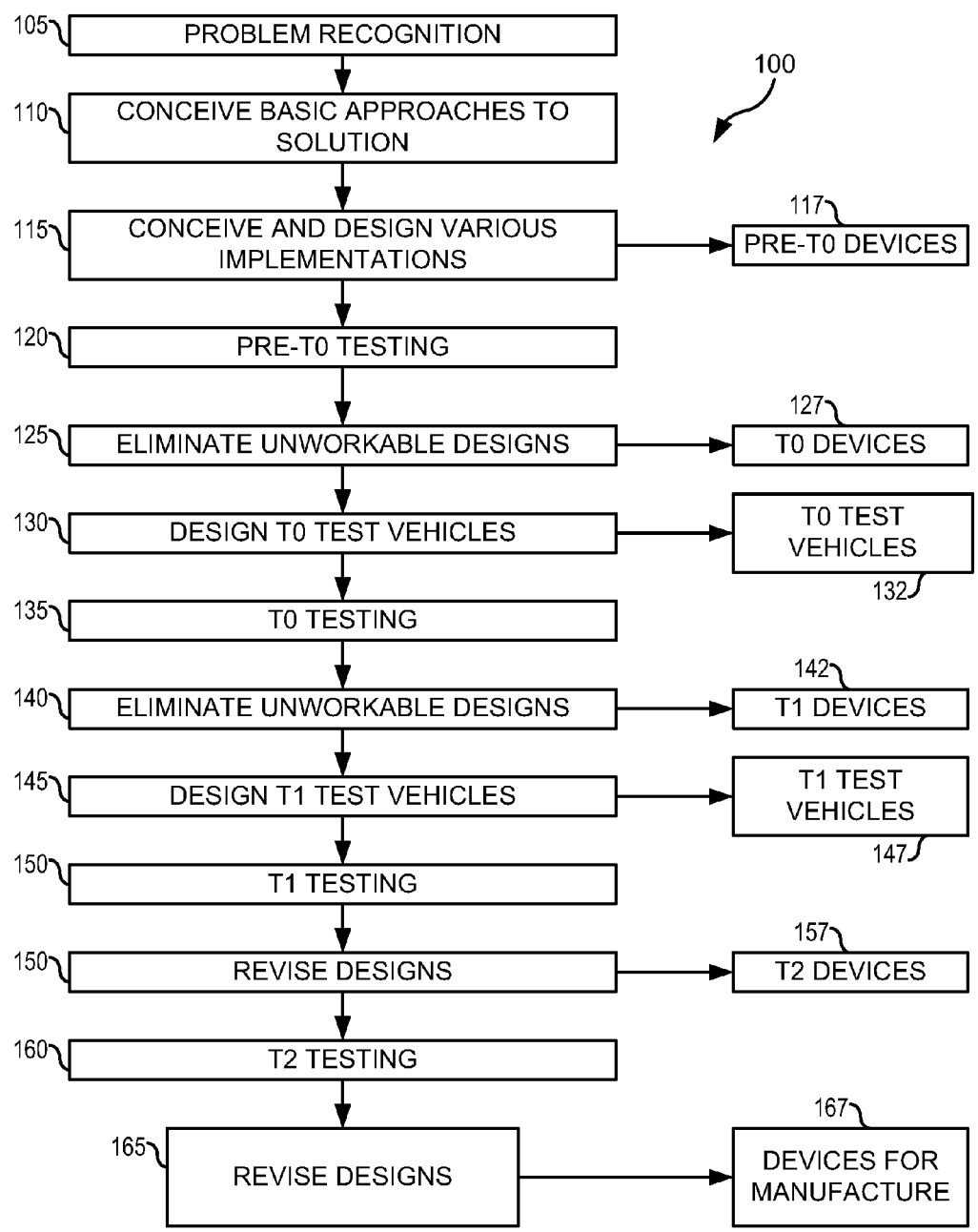
FIG. 1 illustrates a block diagram showing selected steps of a common device development cycle in accordance with the Prior Art.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 2:
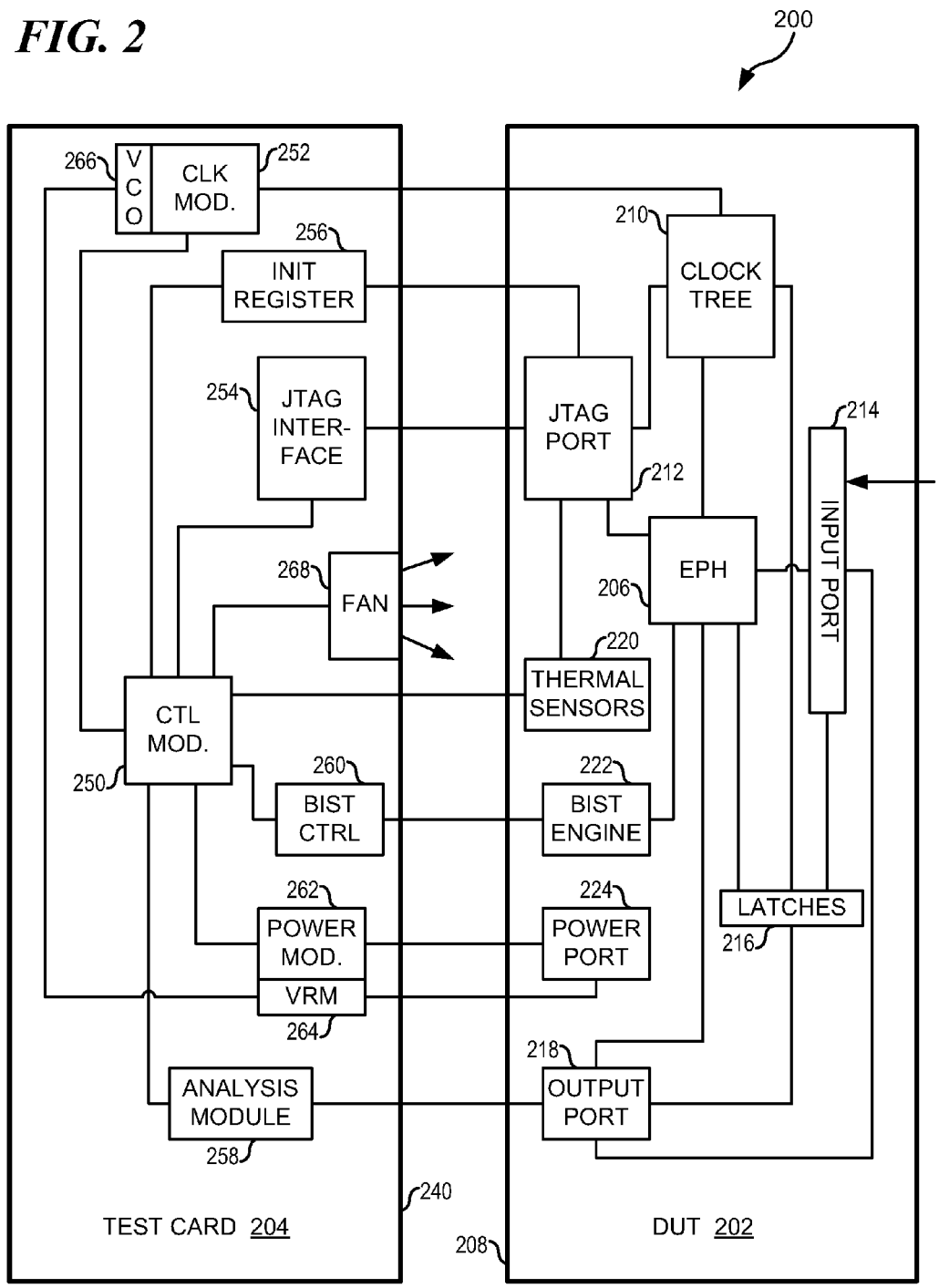
FIG. 2 illustrates a block diagram showing an improved electronic device development system in accordance with a preferred embodiment.

Referring now to the drawings, FIG. 2 is a high-level block diagram illustrating certain components of a system 200 for improved electronic product development, in accordance with a preferred embodiment of the present invention. Generally, the embodiments disclosed herein use a novel set of circuit functions on a test vehicle card, which tests an earlier development version of a product module under development, to do technology qualification using the product as the test vehicle. More specifically, system 200 comprises a device under test (DUT) 202 coupled to a test card 204.

One skilled in the art will understand that the characteristics that make a particular test vehicle suitable for use in evaluating a technology involve observeability of the sensitive parameters of a given technology; the ability to stress the technology implementation to known levels; the ability to stress the part to failure; and cost management. As described in more detail below, the test vehicles described herein, such as DUT 202, for example, provide technical advantages that meet or exceed these criteria. Generally, DUT 202 comprises "early product hardware" (EPH) 206 mounted or otherwise embedded on a mount plane 208.

As used herein, "early product hardware" means an electronic circuit, device, or other technology under development, generally characterized as a pre-T1 device. That is, EPH 206 comprises technology that would typically be classified as a pre-T0 device 117 or a T0 device 127 under the conceptual framework described above with respect to FIG. 1. One skilled in the art will understand that precise boundaries between T0 devices and T1 devices can be difficult to determine. Generally, in one embodiment, a pre-T1 device is a device or other technology under development, which has not yet been subjected to vendor-tooled test vehicle testing. Mount plane 208 is an otherwise conventional mount plane, and can comprise a substrate, printed circuit board, or other suitable device for mounting, or embodying, EPH 206.

In the illustrated embodiment, DUT 202 also includes a clock tree 210, a JTAG port 212, an input port 214, a plurality of latches 216, and an output port 218. Generally, clock tree 210 is an otherwise conventional clock tree and is generally configured to receive and distribute a clock signal to the other components of DUT 202, particularly EPH 206. As such, clock tree 210 can comprise clock nets, signal nets, or other suitable distribution networks. In one embodiment, clock tree 210 is a clock signal distribution network.

Generally, JTAG port 212 is a test input port and can comprise a number of suitable test input ports, such as, for example, a JTAG port, an FSI (flexible script interface), or other suitable test input port. In the illustrated embodiment, JTAG port 212 is an otherwise conventional JTAG port, and is generally configured to receive JTAG inputs and to distribute JTAG commands to various components of DUT 202, as one skilled in the art will understand. Additionally, in one embodiment, JTAG port 212 serves as the primary configuration interface for DUT 202, and therefore is configured to receive a variety of commands. In one embodiment, JTAG port 212 is configured to turn on or otherwise enable clock signals from or through clock tree 210, set or otherwise maintain a clock frequency, and to open or otherwise reset all or a subset of the latches of DUT 202. In an alternate embodiment, JTAG port 212 is configured to perform boundary scan operations.

Input port 214 is an otherwise conventional input port. In one embodiment, input port 214 comprises signal receivers configured to receive input signals that simulate signals expected to be sent to DUT 202 when incorporated into a higher-level system. Latches 216 are a plurality of otherwise conventional latches, and are generally configured based on the particular design under evaluation in the DUT 202. Output port 218 is an otherwise conventional output port. In one embodiment, output port 218 comprises drivers configured to output data or other signals that simulate signals expected to be send from DUT 202 when incorporated into a higher-level system.

In the illustrated embodiment, DUT 202 also includes thermal sensors 220, BIST engine 222, and power port 224. Generally, thermal sensors 220 are otherwise conventional thermal sensors and are configured to produce an output signal based on a temperature condition on DUT 202. In one embodiment, thermal sensors 220 are resistive sensors. Power port 224 is an otherwise conventional power input port. Generally, power port 224 serves as a power supply coupling for DUT 202, and therefore also couples to various devices and/or power distribution networks of DUT 202. In one embodiment, clock tree 210 serves to modulate power consumption of the DUT 202. In an alternate embodiment, clock tree 210 serves as a clock distribution network, and power port 224 couples power to one or more components or portions of components of DUT 202.

BIST engine 222 is an otherwise conventional BIST engine, configured for logic built-in self test (LBIST) or array BIST (ABIST) operations for DUT 202. In one embodiment BIST engine 222 is configured for either LBIST or ABIST operations. In an alternate embodiment, BIST engine 222 comprises both an LBIST engine and an ABIST engine.

As described above, DUT 202 couples to a test card (TC) 204. Generally, TC 204 comprises a plurality of modules and other components mounted or otherwise embedded on a mount plane 240. Mount plane 240 is an otherwise conventional mount plane, and can comprise a substrate, printed circuit board, or other suitable device for mounting, or embodying, the various modules and other components of TC 204.

In the illustrated embodiment, TC 204 also includes a control module 250, a clock module 252, a JTAG interface 254, an initialization register 256, and an analysis module 258. Generally, control module 250 is a circuit or circuits configured to control one or more of the other various modules and/or components of TC 204. As such, control module 250 is configured for a variety of operations, described in more detail below. For example, control module 250 coupled to clock module 252 and is configured to provide control signals to clock module 252, generally indicating a desired clock frequency to clock module 252.

Clock module 252 is an otherwise conventional clock module and, in one embodiment, includes a clock generator configured to produce a clock signal at a variety of frequencies.

As illustrated, clock module 252 coupled to clock tree 210 and is generally configured to transmit a clock signal to clock tree 210 at a clock frequency designated in a control signal or signals from control module 250. In one embodiment, JTAG port 212 indicates the clock frequency to clock tree 210. In an alternate embodiment, the frequency is transparent to clock tree 210.

Generally, JTAG interface 254 is a test input port interface, configured to operate with the JTAG port 212 of DUT 202. As such, in one embodiment, where JTAG port 212 is an FSI port, JTAG interface 254 is an FSI interface. In the illustrated embodiment, JTAG interface 254 is an otherwise conventional JTAG interface, and is generally configured to receive commands from control module 250 and to provide JTAG inputs to JTAG port 212 based on received commands. In one embodiment, control module 250 sends test data to DUT 202 through JTAG interface 254 and JTAG port 212. As used herein, "test data" includes configuration and initialization data and/or commands, as well as data configured to provide test or status information when processed through the device under test.

Initialization register 256 is a register or other suitable storage medium configured to store initialization data. Accordingly, initialization register 256 couples to JTAG port 212. In one embodiment, initialization register 256 is an erasable programmable read-only memory (EPROM). In an alternate embodiment, initialization register is an electronically erasable PROM (EEPROM). In an alternate embodiment, initialization register 256 comprises a plurality of latches. One skilled in the art will recognize other suitable configurations.

Generally, initialization register 256 receives initialization data and/or commands from control module 250. On power-on, reset, or when otherwise instructed, initialization register 256 passes its data to DUT 202 through, in the illustrated embodiment, JTAG port 212. For example, during power aging and power cycling tests, the test card powers on and off the DUT for hundreds or thousands of hours. In one embodiment, initialization register 256 comprises initialization and other setup data for DUT 202, which DUT 202 retrieves as an initialization sequence on start up, through JTAG port 212. So configured, initialization register 256 relieves the control module 250 from processing and transmitting the initialization commands for every power on/off cycle, which decreases overall test setup time.

Analysis module 258 couples to control module 250 and output port 218 of DUT 202. Generally, analysis module 258 receives and stores the output data from DUT 202. Control module 250 reads the data from analysis module 258. In one embodiment, analysis module 258 is a register or other suitable storage medium. In an alternate embodiment, analysis module further comprises hardware or software logic configured to analyze or otherwise process the DUT output data.

In the illustrated embodiment, TC 204 also includes BIST controller 260, power module 262, and fan 268. Generally, BIST controller 260 is an otherwise conventional BIST controller, and couples to control module 250 and BIST engine 222. In one embodiment, BIST controller 260 is an interface between control module 250 and BIST engine 222. As described above, BIST engine 222 can be configured for LBIST and/or ABIST operations. Accordingly, BIST controller 260 is similarly configured for LBIST and/or ABIST operations. Additionally, BIST controller 260 can be configured for both LBIST and ABIST operations, in order to test DUTs that are configured for either LBIST or ABIST operations.

Power module 262 is an otherwise conventional power module and couples to power port 224 of DUT 202. Generally, in one embodiment, power module 262 also serves as a power supply coupling for TC 204, and therefore also couples to various devices and/or power distribution networks of TC 204. As described above, in one embodiment, power module 262 also supplies power to DUT 202 through power port 224.

In the illustrated embodiment, power module 262 includes voltage regulator module (VRM) 264, which couples to power port 224. In one embodiment, VRM 264 receives a feedback signal from power port 224, indicating the power usage of DUT 202, and generates an output signal to power module 262. In one embodiment, the feedback signal is based on a voltage associated with power port 224. Power module 262 receives the output signal and adjusts power delivery to DUT 202 according to the received signal. Accordingly, power module 262 and VRM 264 can be configured to regulate power delivery to DUT 202.

In the illustrated embodiment, VRM 264 also couples to a voltage controlled oscillator (VCO) 266 of clock module 252. In one embodiment, VCO 266 is an otherwise conventional VCO and couples to VRM 264 to receive the VRM output signal. VCO 266 and clock module 252 provide a clock signal to clock tree 210 based on the received VRM output signal. Accordingly, VCO 266 and clock module 252 can be configured to regulate clock signal delivery to DUT 202.

Thus, in one embodiment, VRM 264 provides an indication of the current output from power module 262 to DUT 202. With this indication, TC 204, through control module 250 and power module 262, can modulate the current into DUT 202. In one embodiment, TC 204, through control module 250 and VCO 266, can modulate the current into DUT 202 by a negative feedback path controlling the clock frequency into the DUT 202. That is, for example, the VRM 264 current controls the clock input to clock tree 210 through VCO 266 such that higher current results in lower clock frequency.

In the illustrated embodiment, TC 204 also includes a fan 268. Fan 268 is an otherwise conventional mechanical fan, configured to move air. Fan 268 couples to control module 250 and operates in response to control signals from control module 250. In one embodiment, the control signals comprise voltage supply signals. In an alternate embodiment, the control signals comprise pulse width modulation (PWM) signals. As described above, control module 250 couples to thermal sensors 220 of DUT 202. As such, in one embodiment, control module 250 monitors a temperature of DUT 202, based on the feedback from thermal sensors 220, and controls fan 268 to blow ambient air across DUT 202, cooling DUT 202 to keep DUT 202 within a predetermined range of temperatures. In an alternate embodiment, thermal sensors 220 are resistive sensors, and control module 250 compares an output of thermal sensors 220 to a reference, and provides a PWM signal to fan 268 based on the comparison.

Accordingly, in one embodiment, TC 204 is designed to test early-development product modules, functional or otherwise, shown as DUT 202 generally and EPH 206 in particular. The illustrated embodiments require only a minimum of test card functionality. For example, at a minimum TC 204 comprises JTAG interface 254 and clock module 252, such that the JTAG and/or other test communication access methods are working sufficiently to perform basic initialization and to configure a working clock tree.

So configured, TC 204 can control clock tree 210, and therefore the DUT 202 power dissipation and current can be controlled to map very closely to how power is distributed in a later-development product application. TC 204 can further controlled the power and current somewhat independently by using the voltage applied to DUT 202 to impact leakage current as well as the switching current consumed by the functioning circuits of DUT 202, such as EPH 206, for example. Further, in one embodiment TC 204 using the clock operating frequency control the switching current consumed by the functioning circuits of DUT 202.

Additional TC 204 modules as illustrated, such as fan 268 and control module 250 provide additional advantages. For example, while still maintaining limited control over DUT 202, TC 204 can still control the DUT 202 die temperature over the course of testing. Additionally, where DUT output port 218 couples to DUT input port 214, TC 204 can also perform input/output (I/O) wrap testing and route testing.

Thus, in a preferred embodiment, control module 250 uses JTAG interface 254 to send various commands to DUT 202. For example, in one embodiment, the various commands include commands and other data to initialize clock tree 210, initialize I/O wrap testing, and initialize thermal sensors 220. In the illustrated embodiment, TC 204 also includes BIST controller 260. In an alternate embodiment, TC 204 also initializes BIST engine 222 through JTAG interface 254. In one embodiment, BIST engine 222 or latches 216 includes a cache of test code, which can be applied to EPH 206 according to commands from TC 204.

Wrapping the output port 218 to input port 214 also provides certain advantages. Thus, TC 204 can wrap the output signals on DUT 202 to assess the reliability of the module-to-card interface (not shown), whether it is based on ball grid array (BGA), land grid array (LGA), or other technology. Further, the wrapped nets can stress application net rules with regard to length (attenuation), skews (timing), or other items such as net impedance, which can be desirable for characterization prior to general product card availability.

Accordingly, DUT 202 can be configured for any of the powered cells in a qualification plan including power dwell and cycling, thermal characterization, second level attach vibration and temperature cycling. DUT 202 can also be configured as a pre- and post-impact assessment vehicle for non-power or non-mounted testing, such as, for example deep thermal cycling. Moreover, if the particular EPH 206/DUT 202 under consideration includes a standby voltage domain that does not dissipate power beyond a certain threshold, and allows retention of the JTAG configuration, TC 204 can power cycle DUT 202 by switching power on and off to the rest of the power domains on DUT 202. For power cycle cells where the JTAG will have to reload the processor after reapplication of power to the rest of the test vehicle card, initialization register 256 provides a simple serial data stream applied to JTAG port 212 for each reload instead of having to reload via a test access environment normally used for full control access of microprocessor modules.

Thus, by using the test card described herein, as opposed to qualification testing in situ in a later-development, product-level card, frees the qualification test engineer to stress the EPH 206/DUT 202 to failure limits that might otherwise first destroy components and technologies present in other areas of the later-development product-level card. Stressing the EPH 206/DUT 202 modules failure mechanisms to fail (as opposed to those of other components on a card), helps characterize acceleration factors of intrinsic failure mechanisms with test times significantly shorter than the product life requirements. The test engineer can then used these acceleration factors to extrapolate and project the expected reliability and wear-out of the module in a product-level operational environment.

Figure 3:
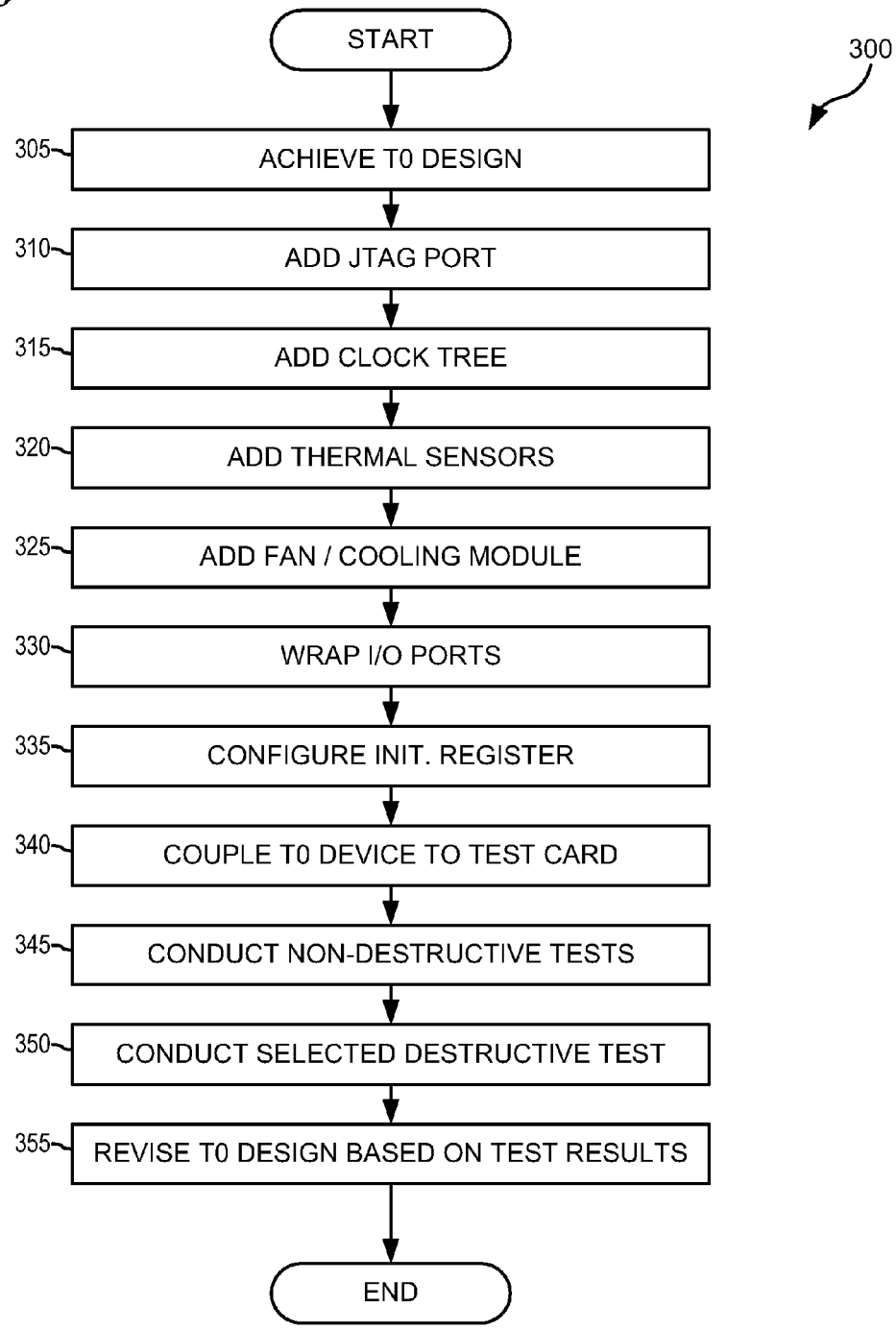
FIG. 3 illustrates a high-level flow diagram depicting logical operational steps of an improved electronic device development method, which can be implemented in accordance with a preferred embodiment.

FIG. 3 illustrates one embodiment of a method for electronic device development that illustrates some advantages of system 200. Specifically, FIG. 3 illustrates a high-level flow chart 300 that depicts logical operational steps performed by, for example, system 200 of FIG. 2, which may be implemented in accordance with a preferred embodiment.

As indicated at block 305, the process begins, wherein the design engineer achieves a T0 design. Generally, this step includes identifying a particular EPH 206 for testing, and results in a basic "device under test". Next, as illustrated at block 310, the design engineer "adds" a JTAG port to the T0 design. As used herein, "adding" a port or other module includes enabling modules otherwise present on the EPH/DUT under consideration. In one embodiment, this step includes mounting or otherwise embodying the EPH on a mount plane or other suitable substrate, to which the JTAG port also couples.

Next, as indicated at block 315, the design engineer ads a clock tree to the DUT. As described above, testing can include testing the clock distribution network. Accordingly, this step can include adding a clock tree under test. Next, as indicated at block 320, the design engineer adds thermal sensors to the DUT.

Next, as illustrated at block 325, the design engineer adds a fan or other suitable cooling module to the DUT. In one embodiment, as described above, this step includes adding a fan to the test card, instead of the DUT. In an alternate embodiment, this step can include adding a fan or other cooling module to the DUT, under the control of the test card.

Next, as indicated at block 330, the design engineer wraps the I/O ports of the DUT. In one embodiment, this step includes coupling an output port (driver) to an input port (receiver) on the DUT. In a particular embodiment, the test card wraps functional output signals from the DUT to functional input signals of the DUT.

Next, as indicated at block 335, the design engineer configures an initialization register. For example, as described above, TC 204 includes an initialization register 256, which can support simplified DUT initialization over the course of multiple power on/off cycles. Next, as indicated at block 340, the design engineer couples the DUT to the test card. As described above, this step can include coupling the DUT to the test card in a variety of couplings. In one embodiment, JTAG interface 254 of TC 204 couples to JTAG port 212 of DUT 202.

Next, as indicated at block 345, the design engineer conducts non-destructive testing of the DUT. Next, as indicated at block 350, the design engineer conducts a predetermined or otherwise selected destructive test of the DUT. Next, as indicated at block 355, the design engineer revises the T0 design based on the test results. One skilled in the art will understand that the above method includes a number of steps that are not included in every environment, such as, for example, the destructive testing of step 350.

Thus, generally, the disclosed embodiments provide numerous advantages over other methods and systems. For example, by designing a simple test card that accurately reflects the mechanical aspects of the early product hardware card, and allows the testing of the actual EPH module, early test phases can be eliminated and the amount of final product hardware for the final qualification phases can be greatly reduced.

Additionally, in Prior Art systems, certain functional aspects could not be tested to failure, because other components on a product-level card would fail before the components under consideration. In the embodiments disclosed herein, newly developed technology can be tested to failure before incorporation into a late-development product-level card.

Additionally, in Prior Art systems, design engineers had to wait for firmware to be developed and debugged before testing certain EPH components. In the embodiments disclosed herein, the design engineers can perform certain functional tests with minimal JTAG commands, on EPH before firmware development is complete.

Additionally, in typical development environments, the actual cost to build the test cards and DUTs described herein can be minimal. In many cases, the EPH/DUT modules are partially functional modules that are the natural fallout of other module testing, and in other circumstances would only be considered mechanically good samples. Further, even with applicable subassemblies such as the VRMs and fans and possibly other sub-circuits, the cost of a destructive failure analysis can be minimal. In fact, the cost of such a simple DUT can be low enough to justify destructive Failure Analysis to diagnose failures of the modules under test.

Additionally, the technologies tested in the embodiments disclosed herein are generally those intended to be used in a final late-development product, in an environment both external and within the part that duplicates the product. This is not the case with the traditional Prior Art method of technology qualification using a custom test vehicle, especially a T0 test vehicle, which often allows the testing of individual new technologies, but do not accurately reflect interaction of these technologies in the final late-development product. One skilled in the art will recognize numerous other technical advantages.

It will be appreciated that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A test card system for use in product development, comprising:
    a device under test (DUT) comprising early product hardware;
    wherein early product hardware comprises hardware developed in a series of development stages up to but not including a vendor-tooled test vehicle testing stage;
    the DUT further comprising:
        a mount plane;
        a power input port coupled to the mount plane;
        a JTAG input port coupled to the mount plane;
        a clock signal distribution network coupled to the JTAG input port;
        a plurality of latches coupled to the clock signal distribution network and the power input port; and
        an output port coupled to the plurality of latches; and
    a test card (TC) coupled to the DUT, comprising:
        a JTAG interface coupled to the DUT JTAG input port and configured to provide test data to the DUT;
        a clock module coupled to the DUT clock signal distribution network and configured to generate a clock signal; and
        an analysis module coupled to the DUT output port and configured to receive data from the DUT.

2. The system of claim 1, wherein the DUT further comprises an input port coupled to the plurality of latches, and wherein the DUT output port further coupled to the DUT input port.

3. The system of claim 1, wherein the DUT further comprises thermal sensors coupled to the mount plane, and wherein the TC further couples to the DUT thermal sensors.

4. The system of claim 3, wherein the TC further comprises a fan, and wherein the TC is configured to operate the fan based on feedback received from the DUT thermal sensors.

5. The system of claim 3, wherein the thermal sensors are resistive sensors.

6. The system of claim 5, wherein the TC further comprises:
    a fan coupled to a control circuit;
    the control circuit coupled to the thermal sensors and configured to compare a voltage across the thermal sensors with a reference voltage to generate a comparison result; and
    wherein the control circuit is further configured to generate a pulse width modulation signal to control the fan based on the comparison result.

7. The system of claim 1, wherein the TC further comprises a voltage regulator module (VRM) coupled to the DUT power input and configured to generate a VRM feedback signal.

8. The system of claim 7, wherein the TC further comprises a voltage controlled oscillator (VCO) coupled to the VRM and the clock module and configured to generate a VCO output based on the VRM feedback signal, and wherein the clock module is configured to generate a clock signal based on the VCO output.

9. The system of claim 1, wherein the TC further comprises a register coupled to the DUT JTAG input port and comprising initialization data.

10. The system of claim 1, wherein the TC is further configured to conduct failure analysis on the DUT.

11. The system of claim 1, wherein the DUT further comprises a built-in self-test (BIST) engine, and the TC is further configured to configure the DUT BIST engine.

12. The system of claim 1, wherein the TC is further configured to perform at least one of the following tests on the DUT: power dwell and cycling, thermal characterization, second level attach vibration, and temperature cycling.

13. A method for electronic product development, comprising:
    configuring a device under test (DUT) to comprise:
        early product hardware (EPH) for development;
        wherein early product hardware comprises hardware developed in a series of development stages up to but not including a vendor-tooled test vehicle testing stage;
        a JTAG input port coupled to the EPH;
        a clock signal distribution network coupled to the EPH; and
        an output port;
    coupling a test card (TC) to the DUT, the TC comprising:
        a JTAG interface coupled to the DUT JTAG input port;
        a clock module coupled to the DUT clock signal distribution network; and
        an analysis module coupled to the DUT output port;
    providing, by the TC, a clock signal to the DUT;
    providing, by the TC, test initialization commands to the DUT;

wherein the test initialization commands comprise initial settings for latches of the DUT; and receiving, by the TC, a test response of the DUT.

14. The method of claim 13, further comprising providing a register of initialization commands coupled to the DUT.

15. The method of claim 13, further comprising monitoring a temperature of the DUT and activating a fan coupled to the DUT based on the monitored temperature.

16. The method of claim 13, further comprising monitoring a power supply voltage of the DUT and activating a voltage regulator module based on the monitored power supply voltage.

17. The method of claim 13, further comprising conducting, by the TC, failure analysis testing on the DUT.

18. The method of claim 13, further comprising directly coupling the DUT test response into input ports on the DUT.

* * * * *